United States Patent
Lin et al.

(10) Patent No.: US 10,408,870 B2
(45) Date of Patent: Sep. 10, 2019

(54) CAPACITOR SENSOR APPARATUS AND SENSING METHOD THEREOF

(71) Applicant: HIMAX TECHNOLOGIES LIMITED, Tainan (TW)

(72) Inventors: Chang-Hui Lin, Tainan (TW); Yaw-Guang Chang, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 233 days.

(21) Appl. No.: 15/363,837

(22) Filed: Nov. 29, 2016

(65) Prior Publication Data
US 2017/0370976 A1 Dec. 28, 2017

Related U.S. Application Data

(60) Provisional application No. 62/355,861, filed on Jun. 28, 2016.

(51) Int. Cl.
*G01R 27/26* (2006.01)
*G01D 5/24* (2006.01)

(52) U.S. Cl.
CPC .......... *G01R 27/2605* (2013.01); *G01D 5/24* (2013.01)

(58) Field of Classification Search
None
See application file for complete search history.

(56) References Cited

U.S. PATENT DOCUMENTS

| | | | | |
|---|---|---|---|---|
| 6,621,860 B1* | 9/2003 | Yamaguchi | ............ | G01R 29/26 324/620 |
| 2009/0322351 A1* | 12/2009 | McLeod | ................ | G06F 3/0416 324/658 |
| 2010/0060610 A1 | 3/2010 | Wu | | |
| 2010/0231239 A1* | 9/2010 | Tateishi | .................... | G01D 5/24 324/672 |
| 2012/0169641 A1 | 7/2012 | Wang et al. | | |
| 2012/0293446 A1* | 11/2012 | Crandall | ................ | G06F 3/044 345/174 |
| 2016/0004347 A1* | 1/2016 | Lin | ......................... | G06F 3/044 345/174 |
| 2016/0132147 A1* | 5/2016 | Lim | ........................ | G06F 3/044 345/174 |
| 2016/0148034 A1* | 5/2016 | Kremin | ................ | G06K 9/0002 382/124 |

FOREIGN PATENT DOCUMENTS

| | | |
|---|---|---|
| CN | 104335073 | 2/2015 |
| TW | 201031932 | 9/2010 |
| TW | 201617819 | 5/2016 |

OTHER PUBLICATIONS

"Office Action of Taiwan Counterpart Application," dated Jun. 27, 2017, p. 1-p.

* cited by examiner

*Primary Examiner* — Melissa J Koval
*Assistant Examiner* — Nasima Monsur
(74) *Attorney, Agent, or Firm* — P.C. Patents

(57) ABSTRACT

A capacitor sensor apparatus and a sensing method thereof are provided. Oscillation signals with different frequencies are provided to a driving circuit and a mixer separately. The mixer mixes the oscillation signal with a lower frequency with a band-pass filtered signal. A band-pass filtering operation for generating the band-pass filtered signal is performed on a sensing signal before the mixer performs the mixing operation.

8 Claims, 3 Drawing Sheets

CAPACITOR SENSOR APPARATUS AND SENSING METHOD THEREOF

CROSS-REFERENCE TO RELATED APPLICATION

This application claims the priority benefits of U.S. provisional application Ser. No. 62/355,861, filed on Jun. 28, 2016. The entirety of the above-mentioned patent application is hereby incorporated by reference herein and made a part of this specification.

BACKGROUND OF THE INVENTION

Field of the Invention

The invention relates to a sensor apparatus, and particularly relates to a capacitor sensor apparatus and a sensing method thereof.

Description of Related Art

A conventional capacitor sensing method may determine a frequency band of a measured single according to a physical characteristic of a tested object. For example, a touch chip may use a frequency band of 50 KHz-300 KHz to measure a capacitance variation. However, in application of an active stylus or fingerprint identification, a frequency band of 1 MHz or 10 MHz is probably used to perform the measurement. In a general capacitor sensor apparatus, a modulation device and a demodulation device perform signal modulation and demodulation according to a same oscillation signal, so that problems of frequency asynchronization and phase asynchronization does not exist. However, in order to prevent a capacitor sensing signal from being influenced by adjacent noise signals, the capacitor sensor apparatus is required to be added with a high-order band-pass filter to effectively filter the noises, though the high-order band-pass filter generally has a high price, such that the manufacturing cost of the capacitor sensor apparatus is greatly increased.

Moreover, another method of preventing the capacitor sensing signal from being influenced by the adjacent noise signals is to configure a band-pass filter behind an analog-to-digital converter (ADC), and since the digital band-pass filter has a low cost compared with that of an analog band-pass filter, the manufacturing cost can be decreased, though such method enhances circuit complexity of the ADC.

SUMMARY OF THE INVENTION

The invention is directed to a capacitor sensor apparatus and a sensing method thereof, which effectively decrease circuit complexity of an analog-to-digital converter circuit and a manufacturing cost of the capacitor sensor apparatus.

The invention provides a capacitor sensor apparatus including a capacitor sensing circuit, a driving circuit, a band-pass filter circuit, a mixer, a low-pass filter circuit, an analog-to-digital converter and a signal processing circuit. The driving circuit is coupled to the capacitor sensing circuit, and generates a driving signal to the capacitor sensing circuit according to a first oscillation signal with a first reference frequency, and the capacitor sensing circuit generates a sensing signal. The band-pass filter circuit is coupled to the capacitor sensing circuit, and performs band-pass filtering to the sensing signal to generate a band-pass filtered signal. The mixer is coupled to the band-pass filtering circuit and mixes a second oscillation signal with a second reference frequency with the band-pass filtered signal to generate a mixed signal, where the first reference frequency is greater than the second reference frequency. The low-pass filter circuit is coupled to the mixer, and performs low-pass filtering to the mixed signal to generate a low-pass filtered signal. The analog-to-digital converter is coupled to the low-pass filter circuit, and converts the low-pass filtered signal into a digital signal. The signal processing circuit is coupled to the analog-to-digital converter, and calculates a capacitance sensing amount of the capacitor sensing circuit according to the digital signal.

In an embodiment of the invention, the band-pass filter circuit filters a negative frequency signal component of the sensing signal.

In an embodiment of the invention, the low-pass filter circuit is an anti-aliasing filter circuit.

In an embodiment of the invention, the signal processing circuit includes a delay control circuit and a digital signal processor. The delay control circuit is coupled to the analog-to-digital converter. The digital signal processor is coupled to the delay control circuit, and adjusts a time that the delay control circuit delays the digital signal according to a data frame cycle of the digital signal, so as to synchronously receive the digital signal.

In an embodiment of the invention, the capacitor sensor apparatus further includes a first oscillator, a second oscillator, a first frequency counter, a second frequency counter and a frequency controller. The first oscillator is coupled to the driving circuit and generates the first oscillation signal. The second oscillator is coupled to the driving circuit and generates the second oscillation signal. The first frequency counter performs frequency counting to the first oscillation signal to generate a first frequency count value. The second frequency counter performs frequency counting to the second oscillation signal to generate a second frequency count value. The frequency controller is coupled to the second oscillator, the first frequency counter and the second frequency counter, and controls the second oscillator to adjust a frequency of the second oscillation signal according to the first frequency count value and the second frequency count value.

The invention provides a sensing method for a capacitor sensor apparatus, which includes following steps. A driving signal is generated to a capacitor sensing circuit according to a first oscillation signal with a first reference frequency, and the capacitor sensing circuit generates a sensing signal. Band-pass filtering is performed to the sensing signal to generate a band-pass filtered signal. A second oscillation signal with a second reference frequency is mixed with the band-pass filtered signal to generate a mixed signal, where the first reference frequency is greater than the second reference frequency. Low-pass filtering is performed to the mixed signal to generate a low-pass filtered signal. The low-pass filtered signal is converted into a digital signal. A capacitance sensing amount of the capacitor sensing circuit is calculated according to the digital signal.

In an embodiment of the invention, the step of performing the band-pass filtering to the sensing signal includes filtering a negative frequency signal component of the sensing signal.

In an embodiment of the invention, the step of performing the low-pass filtering to the mixed signal includes performing anti-aliasing filtering to the mixed signal.

According to the above description, in the embodiments of the invention, oscillation signals of different reference frequencies are respectively provided to the driving circuit and the mixer, where the mixer mixes the oscillation signal with the lower reference frequency with the band-pass filtered signal to implement demodulation, so that the analog-to-digital converter is avoided to process a high frequency signal, so as to decrease circuit complexity of the analog-to-digital converter. Moreover, before the signal mixing, the band-pass filter circuit is first applied to perform band-pass filtering to the sensing signal, so as to decrease a specification requirement of the low-pass filter circuit, and accordingly save the manufacturing cost of the capacitor sensor apparatus.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
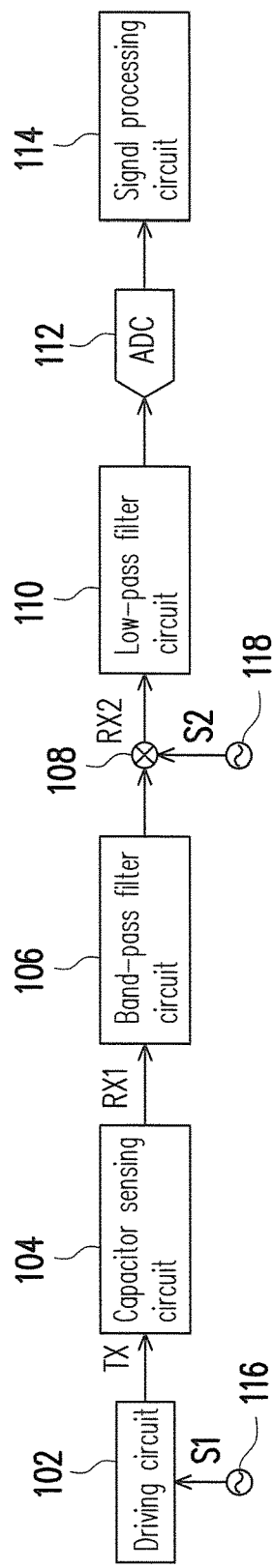
FIG. 1 is a schematic diagram of a capacitor sensor apparatus according to an embodiment of the invention.

FIG. 1 is a schematic diagram of a capacitor sensor apparatus according to an embodiment of the invention. Referring to FIG. 1, the capacitor sensor apparatus can be applied to a capacitive touch device (for example, a mobile phone, a tablet personal computer, etc.), and includes a driving circuit 102, a capacitor sensing circuit 104, a band-pass filter circuit 106, a mixer 108, a low-pass filter circuit 110, an analog-to-digital converter (ADC) 112, a signal processing circuit 114, an oscillator 116 and an oscillator 118, where the driving circuit 102 is coupled to the oscillator 116 and the capacitor sensing circuit 104, the band-pass filter circuit 106 is coupled to the capacitor sensing circuit 104 and the mixer 108, and the mixer 108 is further coupled to the oscillator 118. The low-pass filter circuit 110 is coupled to the mixer 108 and the ADC 112, and the signal processing circuit 114 is coupled to the ADC 112.

The driving circuit 102 generates a driving signal TX to the capacitor sensing circuit 104 according to an oscillation signal S1 provided by the oscillator 116, where the oscillation signal S1 has a first reference frequency, and the capacitor sensing circuit 104 generates a sensing signal RX1. The capacitor sensing circuit 104 may include a sensing capacitor and a signal amplifier (not shown), where the sensing capacitor may generate an electric signal in response to a touch operation of a touch tool (for example, a finger or a stylus), and the signal amplifier may amplify the electric signal generated by the sensing capacitor to output the sensing signal RX1. The band-pass filter circuit 106 may perform band-pass filtering to the sensing signal RX1 to generate a band-pass filtered signal. To be specific, the band-pass filter circuit 106, for example, filters a negative frequency signal component of the sensing signal RX1. The mixer 108 may mix an oscillation signal S2 provided by the oscillator 118 with the band-pass filtered signal to generate a mixed signal RX2, where the oscillation signal S2 has a second reference frequency, and the first reference frequency is greater than the second reference frequency. The low-pass filter circuit 110 may perform low-pass filtering to the mixed signal RX2 to generate a low-pass filtered signal, and the low-pass filter circuit 110 is, for example, an anti-aliasing filter circuit, though the invention is not limited thereto. The ADC 112 converts the low-pass filtered signal into a digital signal for outputting to the signal processing circuit 114, and the signal processing circuit 114 calculates a capacitance sensing amount of the capacitor sensing circuit 104 according to the digital signal, so as to determine whether the capacitor sensing circuit 104 is touched by the touch tool.

In this way, by respectively providing the oscillation signals S1, S2 with different reference frequencies to the driving circuit 102 and the mixer 108, the mixer 108 mixes the oscillation signal S2 with a lower reference frequency with the band-pass filtered signal to implement demodulation, such that the ADC 112 is avoided to process a high frequency signal, so as to decrease the circuit complexity of the ADC 112. Moreover, before the signal mixing, the negative frequency signal component is filtered through the band-pass filter circuit 106, and after the signal mixing, the low-pass filtering is performed to the mixed signal through the low-pass filter circuit 110, such that besides a noise signal is effectively filtered, since the band-pass filtering operation is performed before the signal mixing, positive frequency and negative frequency signal components of the sensing signal RX1 are far away in frequency domain, so that it is unnecessary to configure a high-order band-pass filter to perform the band-pass filtering, and the manufacturing cost of the capacitor sensor apparatus is greatly decreased.

Figure 2:
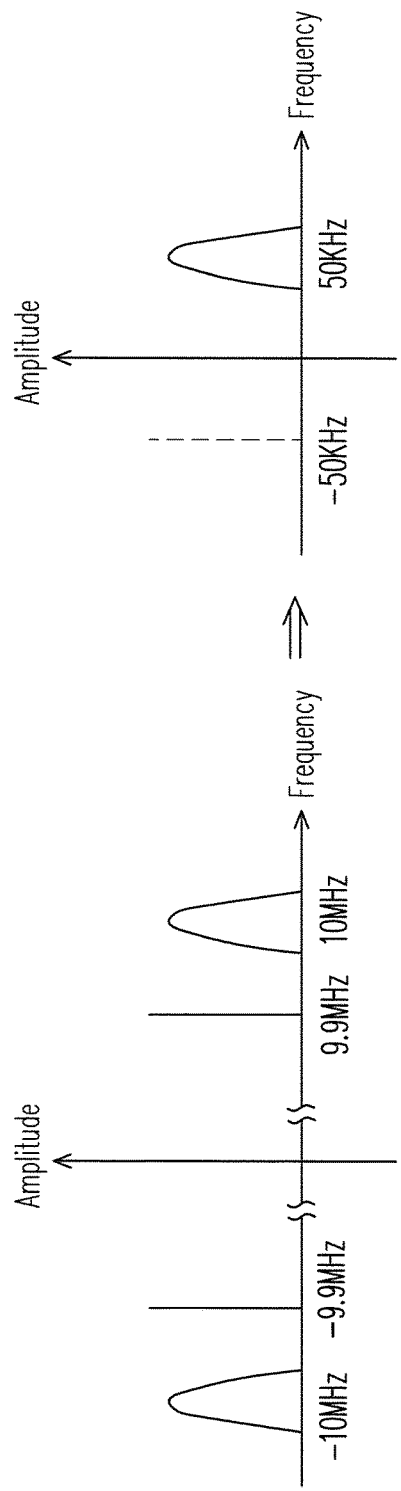
FIG. 2 is a schematic diagram of filtering a sensing signal according to an embodiment of the invention.

For example, FIG. 2 is a schematic diagram of filtering a sensing signal according to an embodiment of the invention. Referring to FIG. 2, in the present embodiment, the sensing signal RX1 includes a positive frequency signal component and a negative frequency signal component of 10 MHz and 9.9 MHz, where the signal at the 9.9 MHz is a noise signal. Since the positive frequency and negative frequency signal components are spaced by 20 MHz in the frequency domain, the negative frequency signal component can be filtered without using the high-order band-pass filter to perform the band-pass filtering operation. After the negative frequency signal component filtered sensing signal RX1 (i.e. the band-pass filtered signal output by the band-pass filter circuit 106) is mixed with the oscillation signal S2 with the lower reference frequency through the mixer 108, the positive frequency signal component can be decreased to 50 KHz, and then the low-pass filter circuit 110 filters the noise signal (shown by dot lines). In this way, the noise signal can be effectively filtered, and the ADC 112 is avoided to process a high frequency signal, such that the circuit complexity of the ADC 112 can be decreased. It should be noted that in the present embodiment, although the sensing signal RX1 of 10 MHz is taken as an example for description, the frequency of the sensing signal RX1 is not limited thereto, and along with different frequencies of the driving signal TX, the sensing signal RX1 may also have other frequency, for example, 1 MHz. Moreover, the frequency of the mixed signal RX2 output by the mixer 108 is not limited to 50 KHz, and a designer may adjust the oscillation signal S2 to a proper frequency, so as to adjust the mixed signal RX2 to the required frequency.

Figure 3:
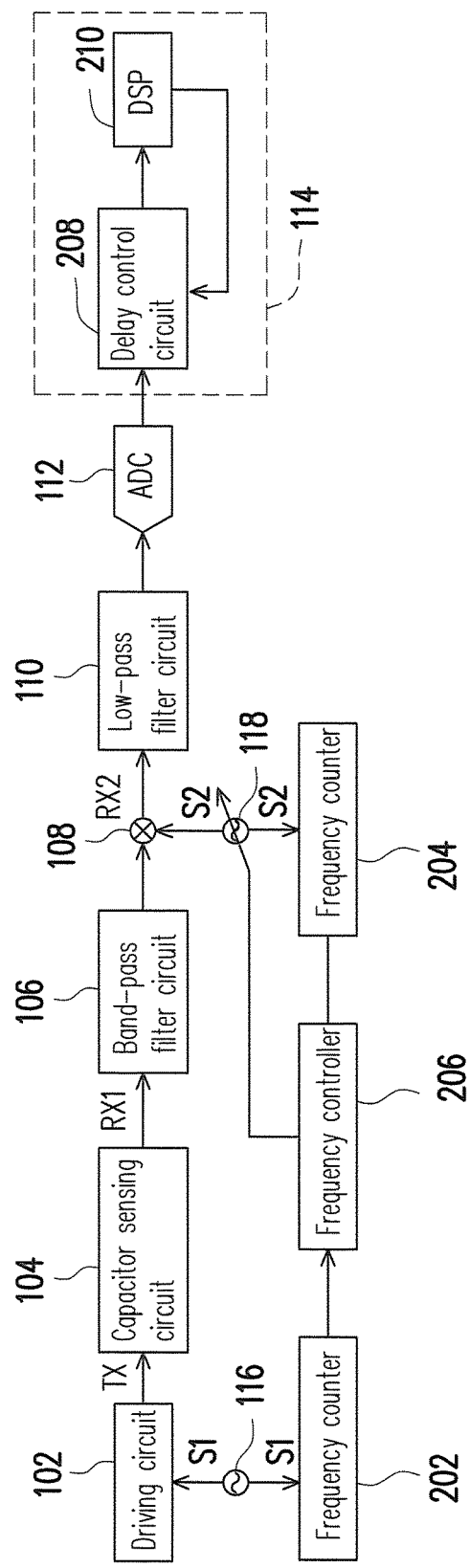
FIG. 3 is a schematic diagram of a capacitor sensor apparatus according to another embodiment of the invention.

FIG. 3 is a schematic diagram of a capacitor sensor apparatus according to another embodiment of the invention. Referring to FIG. 3, in the present embodiment, the capacitor sensing apparatus further includes a frequency counter 202, a frequency counter 204 and a frequency controller 206, where the frequency counter 202 is coupled to the oscillator 116 and the frequency controller 206, and the frequency controller 206 is further coupled to the frequency counter 204 and the oscillator 118, and the frequency counter 204 is further coupled to the oscillator 118. The frequency counter 202 and the frequency counter 204 may respectively perform frequency counting to the oscillation signal S1 and the oscillation signal S2 to respectively generate a first frequency count value and a second frequency count value. The frequency controller 206 may control the oscillator 118 to adjust a frequency of the oscillation signal S2 according to the first frequency count value and the second frequency count value, so as to adjust the frequency of the mixed signal RX2, and avoid a problem of frequency asynchronization caused by different oscillation characteristics of the oscillators 116 and 118. Moreover, the signal processing circuit 114 of the present embodiment may include a delay control circuit 208 and a digital signal processor (DSP) 210, where the delay control circuit 208 is coupled to the ADC 112 and the DSP 210. The DSP 210 may adjust a time that the delay control circuit 208 delays the digital signal according to a data frame cycle of the digital signal output by the ADC 112, so as to synchronously receive the digital signal to ensure that the DSP 210 may start to synchronously sample the data frame at a start position of each data frame of the digital signal output by the ADC 112.

Figure 4:
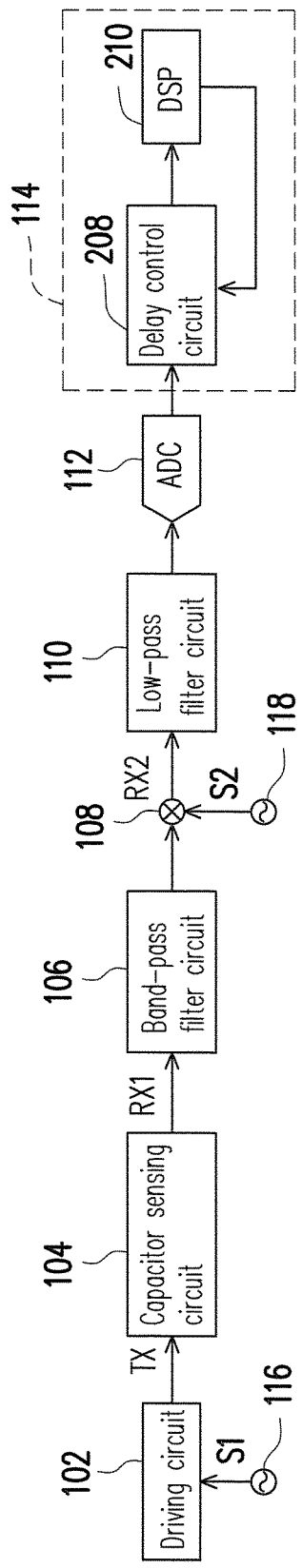
FIG. 4 is a schematic diagram of a capacitor sensor apparatus according to another embodiment of the invention.

FIG. 4 is a schematic diagram of a capacitor sensor apparatus according to another embodiment of the invention. Referring to FIG. 4, in other embodiments, the capacitor sensor apparatus may not include the frequency counter 202, the frequency counter 204 and the frequency controller 206. As shown in FIG. 4, in the capacitor sensor apparatus, the DSP 210 may simply adjust the time that the delay control circuit 208 delays the digital signal according to the data frame cycle of the digital signal output by the ADC 112, so as to ensure that the DSP 210 may start to synchronously sample the data frame at the start position of each data frame of the digital signal output by the ADC 112, by which a frequency synchronization effect and a phase synchronization effect are also achieved.

Figure 5:
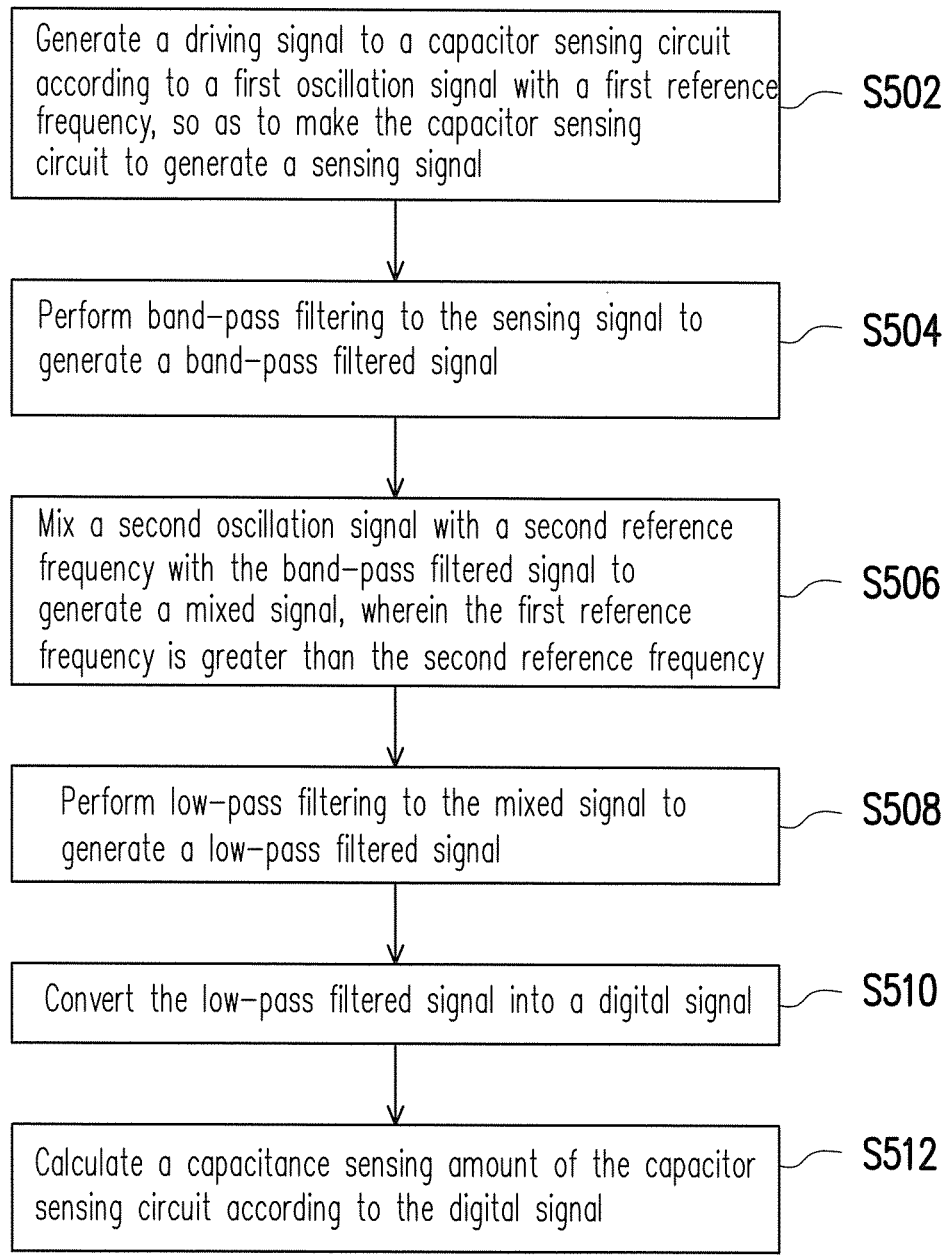
FIG. 5 is a flowchart illustrating a sensing method for a capacitor sensor apparatus according to an embodiment of the invention.

FIG. 5 is a flowchart illustrating a sensing method for a capacitor sensor apparatus according to an embodiment of the invention. Referring to FIG. 5, according to the above embodiment, it is known that the sensing method of the capacitor sensor apparatus may at least include following steps. First, a driving signal is generated to a capacitor sensing circuit according to a first oscillation signal with a first reference frequency, and the capacitor sensing circuit generates a sensing signal (step S502). Then, band-pass filtering is performed to the sensing signal to generate a band-pass filtered signal (step S504), where to perform the band-pass filtering to the sensing signal may filter a negative frequency signal component of the sensing signal. Then, a second oscillation signal with a second reference frequency is mixed with the band-pass filtered signal to generate a mixed signal, where the first reference frequency is greater than the second reference frequency (step S506). Then, a low-pass filtering is performed to the mixed signal to generate a low-pass filtered signal (step S508), for example, anti-aliasing filtering can be performed to the mixed signal, though the invention is not limited thereto. Then, the low-pass filtered signal is converted into a digital signal (step S510). Finally, a capacitance sensing amount of the capacitor sensing circuit is calculated according to the digital signal.

In summary, in the embodiments of the invention, oscillation signals with different reference frequencies are respectively provided to the driving circuit and the mixer, where the mixer mixes the oscillation signal with the lower reference frequency with the band-pass filtered signal to implement demodulation, so that the ADC is avoided to process a high frequency signal, so as to decrease the circuit complexity of the ADC. Moreover, before the signal mixing, the band-pass filter circuit is first applied to perform band-pass filtering to the sensing signal, so as to decrease a specification requirement of the low-pass filter circuit, and accordingly save the manufacturing cost of the capacitor sensor apparatus.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A capacitor sensor apparatus, comprising:
    a capacitor sensing circuit comprising a sensing capacitor and a signal amplifier;
    a driving circuit directly coupled to the capacitor sensing circuit, and generating a driving signal to the capacitor sensing circuit according to a first oscillation signal with a first reference frequency to make the capacitor sensing circuit generating a sensing signal;
    a band-pass filter circuit, coupled to the capacitor sensing circuit, and performing band-pass filtering to the sensing signal to generate a band-pass filtered signal;
    a mixer, coupled to the band-pass filtering circuit, and mixing a second oscillation signal with a second reference frequency with the band-pass filtered signal to generate a mixed signal, wherein the first reference frequency is greater than the second reference frequency;
    a low-pass filter circuit, coupled to the mixer, and performing low-pass filtering to the mixed signal to generate a low-pass filtered signal;
    an analog-to-digital converter, coupled to the low-pass filter circuit, and converting the low-pass filtered signal into a digital signal; and
    a signal processing circuit, coupled to the analog-to-digital converter, and calculating a capacitance sensing amount of the capacitor sensing circuit according to the digital signal.

2. The capacitor sensor apparatus as claimed in claim 1, wherein the band-pass filter circuit filters a negative frequency signal component of the sensing signal.

3. The capacitor sensor apparatus as claimed in claim 1, wherein the low-pass filter circuit is an anti-aliasing filter circuit.

4. The capacitor sensor apparatus as claimed in claim 1, wherein the signal processing circuit comprises:
    a delay control circuit, coupled to the analog-to-digital converter;
    a digital signal processor, coupled to the delay control circuit, and adjusting a time that the delay control circuit delays the digital signal according to a data frame cycle of the digital signal, so as to synchronously receive the digital signal.

5. The capacitor sensor apparatus as claimed in claim 4, further comprising:
   a first oscillator, coupled to the driving circuit, and generating the first oscillation signal;
   a second oscillator, coupled to the driving circuit, and generating the second oscillation signal;
   a first frequency counter, performing frequency counting to the first oscillation signal to generate a first frequency count value;
   a second frequency counter, performing frequency counting to the second oscillation signal to generate a second frequency count value; and
   a frequency controller, coupled to the second oscillator, the first frequency counter and the second frequency counter, and controlling the second oscillator to adjust a frequency of the second oscillation signal according to the first frequency count value and the second frequency count value.

6. A sensing method for a capacitor sensor apparatus, comprising:
   generating a driving signal by a driving circuit, which is directly coupled to a capacitor sensing circuit according to a first oscillation signal with a first reference frequency, so as to make the capacitor sensing circuit to generate a sensing signal, wherein the capacitor sensing circuit comprises a sensing capacitor and a signal amplifier;
   performing band-pass filtering to the sensing signal to generate a band-pass filtered signal;
   mixing a second oscillation signal with a second reference frequency with the band-pass filtered signal to generate a mixed signal, wherein the first reference frequency is greater than the second reference frequency;
   performing low-pass filtering to the mixed signal to generate a low-pass filtered signal;
   converting the low-pass filtered signal into a digital signal; and calculating a capacitance sensing amount of the capacitor sensing circuit according to the digital signal.

7. The sensing method for the capacitor sensor apparatus as claimed in claim 6, wherein the step of performing the band-pass filtering to the sensing signal comprises:
   filtering a negative frequency signal component of the sensing signal.

8. The sensing method for the capacitor sensor apparatus as claimed in claim 6, wherein the step of performing the low-pass filtering to the mixed signal comprises:
   performing anti-aliasing filtering to the mixed signal.

* * * * *